United States Patent [19]

Moriyama

[11] Patent Number: 5,528,512
[45] Date of Patent: Jun. 18, 1996

[54] METHOD OF OBTAINING MASK DATA FOR MANUFACTURING MULTIPLE METAL-INTERCONNECTION LAYERS ON A SUBSTRATE

[75] Inventor: Seiji Moriyama, Tokyo, Japan

[73] Assignee: NEC Corporation, Tokyo, Japan

[21] Appl. No.: 9,594

[22] Filed: Jan. 27, 1993

[30] Foreign Application Priority Data

Jan. 27, 1992 [JP] Japan .................................. 4-011508

[51] Int. Cl.⁶ .............................. G21G 5/00; H01J 37/08; G06F 15/00
[52] U.S. Cl. .......................... 364/491; 364/490; 382/284; 382/283; 382/209; 382/276; 250/492.22; 250/492.1; 250/492.2; 250/492.23
[58] Field of Search ..................... 364/488, 489, 364/490, 491, 492, 559, 578, 552; 324/72.5, 158 F, 158 P; 356/394, 237; 430/275, 5, 22, 942; 250/492.22, 492.23, 492.1, 492.3, 398; 257/211, 700, 207, 206, 923; 327/566; 382/284, 318, 321, 203–205, 209, 199, 283, 264, 218

[56] References Cited

U.S. PATENT DOCUMENTS

| 3,874,916 | 4/1975 | Livesay et al. ............................ 430/275 |
| 4,482,810 | 11/1984 | Cooke ...................................... 364/490 |
| 4,543,660 | 9/1985 | Maeda ...................................... 382/276 |
| 4,701,778 | 10/1987 | Aneha et al. ............................. 257/207 |
| 4,744,047 | 5/1988 | Okamoto et al. ........................ 364/488 |
| 4,783,829 | 11/1988 | Miyakawa et al. ....................... 382/209 |
| 4,791,586 | 12/1988 | Maeda et al. ............................. 364/491 |
| 4,835,705 | 5/1989 | Fujino et al. ............................. 364/491 |
| 4,837,706 | 6/1989 | Iijima ....................................... 395/135 |
| 4,847,788 | 7/1989 | Shimada ................................... 395/135 |
| 4,939,681 | 7/1990 | Yokomizo et al. ...................... 364/578 |
| 4,974,067 | 11/1990 | Suzuki et al. ............................ 358/534 |
| 5,032,890 | 7/1991 | Ushiku et al. ........................... 257/211 |
| 5,062,054 | 10/1991 | Kawakami et al. ..................... 364/491 |
| 5,140,647 | 8/1992 | Ise et al. .................................. 382/284 |
| 5,222,158 | 6/1993 | Takasaki et al. ........................ 382/284 |
| 5,222,159 | 6/1993 | Kawamura et al. .................... 382/283 |
| 5,223,719 | 6/1993 | Takahashi et al. ..................... 250/492.2 |
| 5,225,771 | 7/1993 | Leedy ..................................... 324/158 P |
| 5,247,456 | 9/1993 | Ohe et al. ................................ 364/491 |
| 5,253,182 | 10/1993 | Suzuki ..................................... 364/489 |
| 5,287,290 | 2/1994 | Tabara et al. ............................ 364/489 |
| 5,349,197 | 9/1994 | Sakamoto et al. ................. 250/492.22 |

Primary Examiner—Kevin J. Teska
Assistant Examiner—Jacques H. Louis-Jacques
Attorney, Agent, or Firm—Foley & Lardner

[57] ABSTRACT

In order to obtain mask data for forming multiple metal-interconnection layers on a substrate, a plurality of rectangle patterns are generated which are respectively centered at cross points defined by straight lines that cross over each other at right angles. Further, a plurality of interconnection patterns are generated which are to be formed on the substrate. Subsequently, the rectangle and interconnection patterns are superimposed. The superimposed patterns include a plurality of continuous patterns in addition to the rectangle patterns. Then, the continuous patterns are extracted from the superimposed patterns, after which the rectangle patterns are extracted from the above mentioned superimposed patterns using the extracted continuous patterns. Finally, the extracted rectangle patterns are superimposed on the interconnection patterns. Thus, mask data indicative of the secondly superimposed patterns are determined.

2 Claims, 3 Drawing Sheets

METHOD OF OBTAINING MASK DATA FOR MANUFACTURING MULTIPLE METAL-INTERCONNECTION LAYERS ON A SUBSTRATE

BACKGROUND OF THE INVENTION

1. Field of the Invention

The present invention relates generally to a method of obtaining mask data well suited for forming multiple metal-interconnection layers on a ceramics substrate, and more specifically to such a method via which the thickness of metal plated on the patterns defined by a mask is substantially made constant over an entire layer.

2. Description of the Prior Art

As is known in the art, multilayer interconnections are formed by depositing alternate layers of patterned interconnections separated by dielectric layers.

A first dielectric layer is deposited on the substrate. Then, a patterned thin metal film is formed on the first dielectric layer using a mask and evaporation techniques. Subsequently, the patterned evaporated metal film is plated. Thus, a first patterned metal-interconnection layer is completed on the first dielectric layer. These operations are reiterated until a predetermined number of metal-interconnection layers are formed on the substrate.

When the evaporated metal film patterns are plated, the thickness of metal plated on the patterns should be kept constant over the dielectric layer. However, if the surface density of the evaporated patterns differs depending on portions of the dielectric layer, it is not expected to keep the thickness of the plated metal constant over the entire surface of the dielectric layer.

In more specific terms, if the surface density of the evaporated thin metal patterns of a given portion of the dielectric layer is smaller than that of other portions, the metal film patterns within such a given portion exhibit a thin plated layer. On the contrary, if the surface density of evaporated metal patterns of the given portion of the dielectric layer is larger than that of the other portions, the metal film patterns within such a given portion are plated thickly.

In order to overcome such a difficulty, when a mask is designed for evaporating patterned thin metal film on a dielectric layer, a mask designer adds dummy patterns to a portion with a small surface density in order to average the surface density of the evaporated patterns all over the dielectric layer.

However, according to the known method, the surface density of the evaporated patterns is empirically averaged by simply adding dummy patterns or pseudo-patterns. Therefore, it is extremely difficult to precisely average the surface density of the evaporated patterns on a dielectric layer. Thus, it is no longer expected to make constant the thickness of metal plated on the evaporated metal patterns. This induces difficulties during subsequent formation of the layers. Further, each of the dummy patterns takes the form of a continuous pattern and hence is liable to undesirably transfer signal components between adjacent conductive lines adjacent a dummy pattern.

SUMMARY OF THE INVENTION

It is an object of the present invention to provide a method of obtaining mask data well suited for forming multiple metal-interconnection layers on a substrate.

Another object of the present invention is to provide a method via which the thickness of metal plated on the evaporated metal patterns defined by a mask is substantially kept constant over an entire layer.

In brief, the above objects are achieved by a method wherein in order to obtain mask data for forming multiple metal-interconnection layers on a substrate, a plurality of rectangle patterns are generated which are respectively centered at cross points defined by straight lines that cross over each other at right angles. Further, a plurality of interconnection patterns are generated which are to be formed on the substrate. Subsequently, the rectangle and interconnection patterns are superimposed. The superimposed patterns include a plurality of continuous patterns in addition to the rectangle patterns. Then, the continuous patterns are extracted from the superimposed patterns, after which the rectangle patterns are extracted from the above mentioned superimposed patterns using the extracted patterns. Finally, the extracted rectangle patterns are superimposed on the interconnection patterns. Thus, mask data indicative of the secondly superimposed patterns are determined.

More specifically, one aspect of the present invention comes in a method of obtaining mask data for use in forming multiple metal-interconnection layers on a substrate, comprising the steps of: (a) generating a plurality of rectangle patterns which are respectively centered at cross points defined by straight lines that cross over each other at right angles; (b) generating a plurality of interconnection patterns to be formed on said substrate; (c) superimposing said plurality of rectangle patterns and said plurality of interconnection patterns, and generating first superimposed patterns which include said plurality of rectangle patterns and a plurality of continuous patterns; (d) extracting said continuous patterns from said first superimposed patterns, and generating first extracted patterns; (e) extracting said rectangle patterns from said first superimposed patterns using said first extracted patterns, and generating second extracted patterns; and (f) superimposing said second extracted patterns and said plurality of interconnection patterns, and generating second superimposed patterns which correspond to said mask data.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

One embodiment of the present invention will be discussed with reference to FIGS. 1–3. The following operations which characterize the instant invention will preferably be implemented through the use of computer-aided design (CAD). Each of the patterns of FIG. 2 shows part of an entire pattern.

Figure 1:
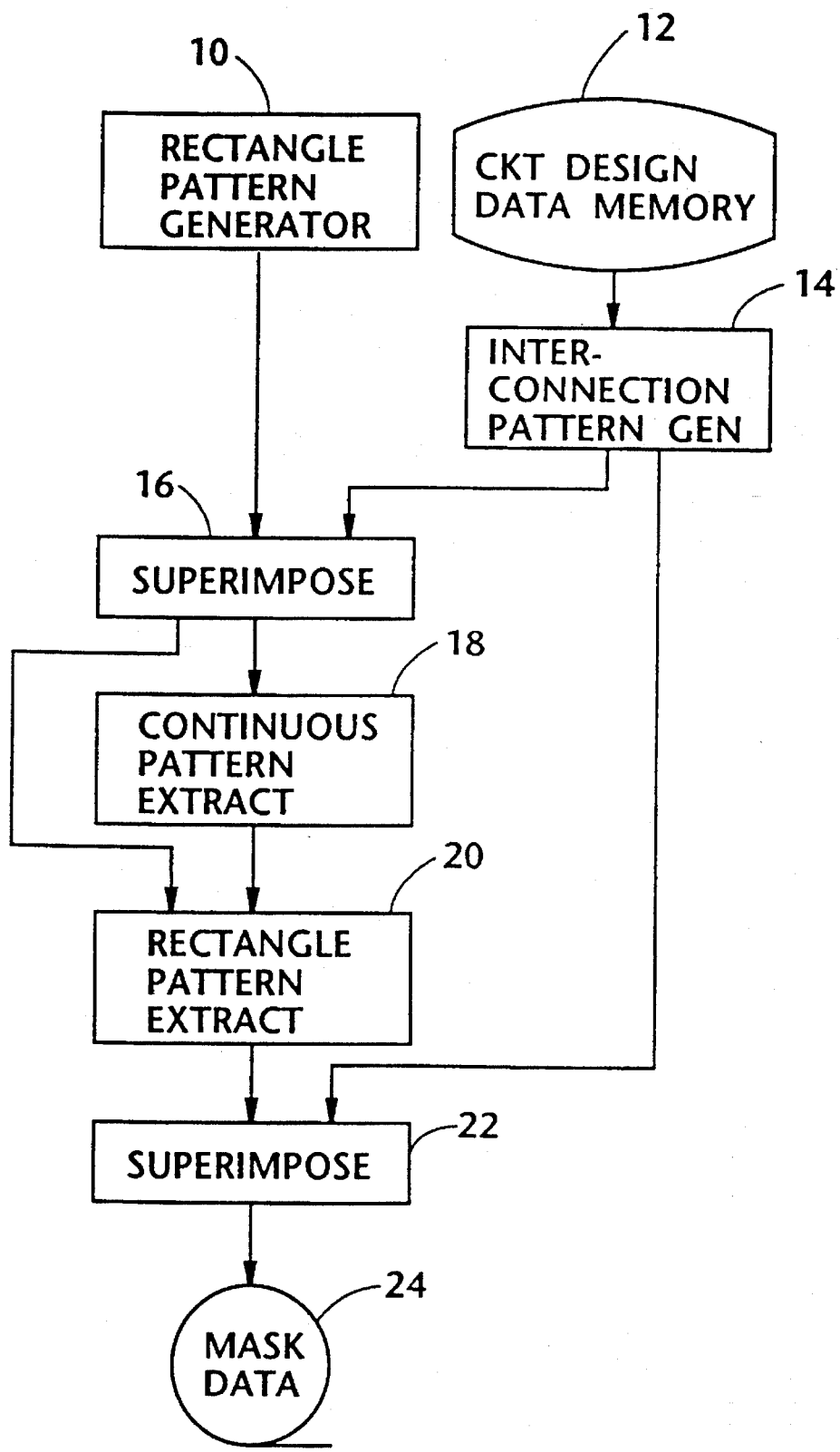
FIG. 1 is a flowchart showing "mask data" generating steps which characterize the present invention.
Figure 2:
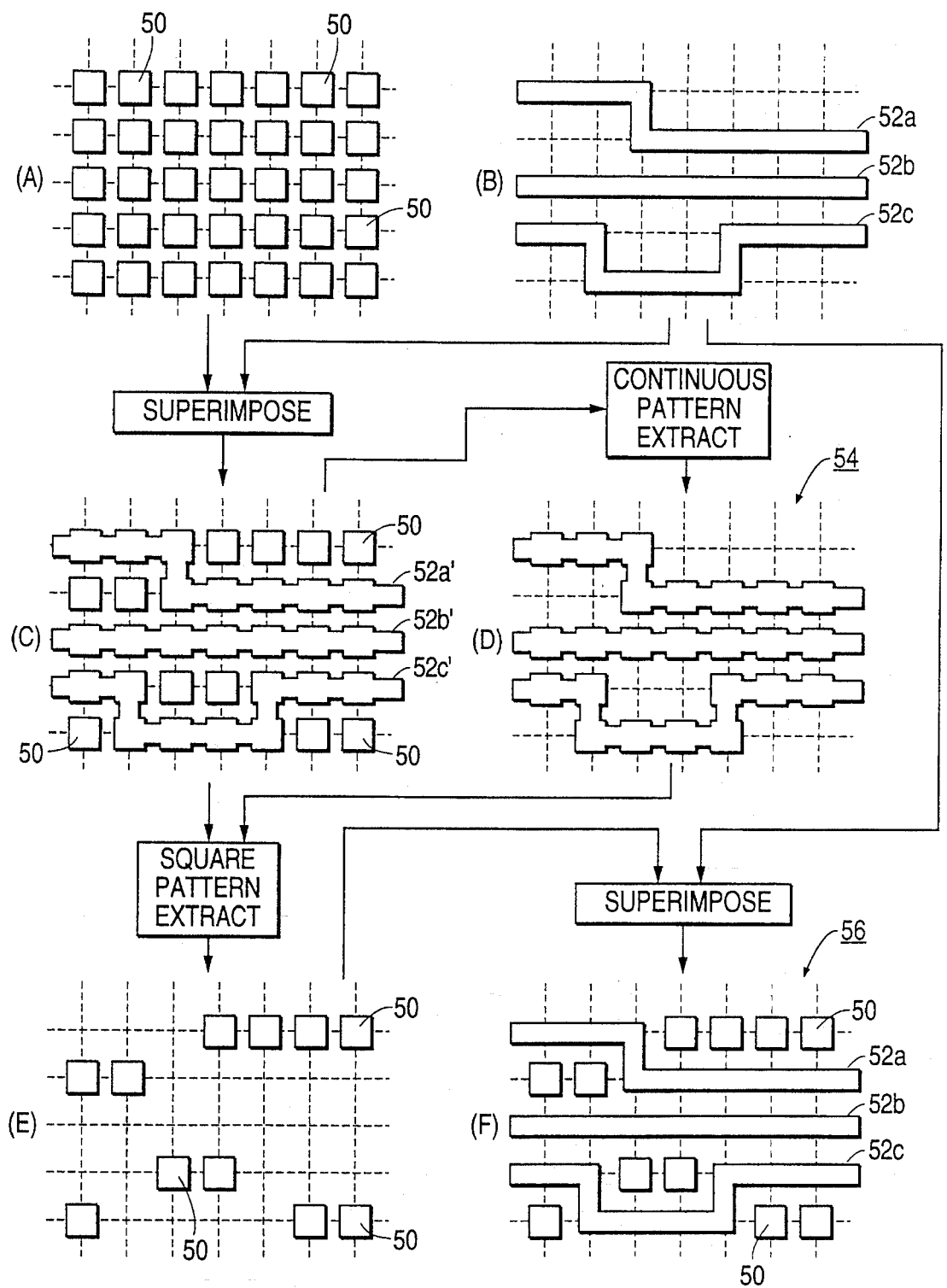
FIG. 2 is a diagram schematically showing a plurality of patterns generated and obtained from the device and in steps shown in the diagram of FIG. 1.

A rectangle pattern generator 10 of FIG. 1 issues a plurality of rectangle patterns 50 shown in portion (A) of FIG. 2. The rectangle patterns are respectively centered at cross points defined by straight lines that cross over each other at right angles. It should be noted that in this particular embodiment, each of the patterns generated from the generator 10 is a square which is centered at a cross point of a grid. Throughout the instant specification, the term "rectangle" includes a square merely for the convenience of discussion.

An interconnection pattern generator 14 retrieves, from a circuit pattern data memory 12, a plurality of interconnection patterns which are depicted by numerals 52a, 52b and 52c in portion (B) of FIG. 2 and which are to be formed on a dielectric layer (not shown).

The rectangle and interconnection patterns thus generated, are superimposed at step 16 (FIG. 1) using a logic OR function (for example). Thus, the patterns which are shown in portion (C) of FIG. 2 are obtained. Following this, a plurality of continuous patterns 52a', 52b' and 52c' (viz., patterns except for the rectangle patterns) shown in portion (C) of FIG. 2, are extracted using a suitable known technique at step 18. The extracted continuous patterns are generally denoted by numeral 54 in portion (D) of FIG. 2.

At step 20, the rectangle patterns are extracted from the patterns shown in portion (C) of FIG. 2 using the patterns obtained at step 18 (portion (D) of FIG. 2). This extraction may be implemented using a logic EXOR (Exclusive OR) function.

At step 22, the interconnection patterns which are generated from the pattern generator 14, are superimposed on the rectangle pattens shown in portion (E) of FIG. 2. Thus, the intended mask patterns (generally depicted by numeral 56) are obtained which are stored in a suitable memory 24.

Figure 3:
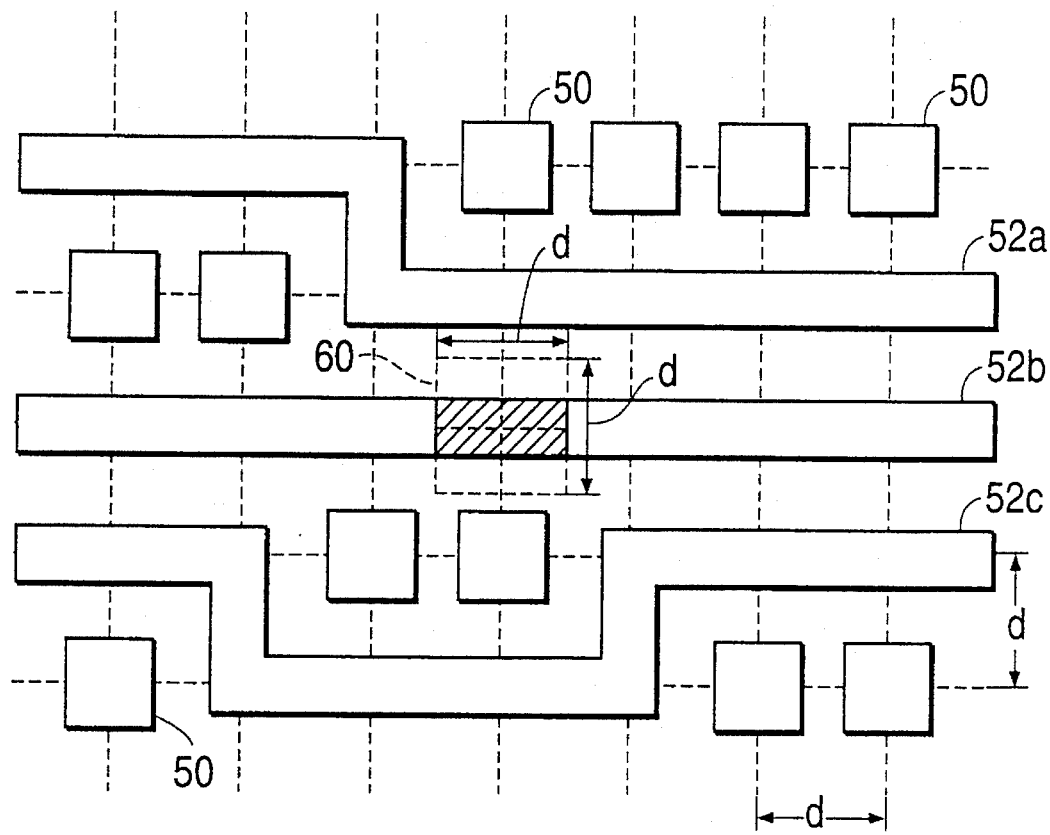
FIG. 3 is a diagram for discussing the area of a rectangle pattern shown in FIGS. 1 and 2.

FIG. 3 is a diagram showing patterns for discussing how to determine the area of each of the rectangles 50. The patterns shown in FIG. 3 correspond to those shown in portion (F) of FIG. 2. The area of each of the rectangle patterns 50 is determined so as to equal the area of the continuous pattern within a rectangle 60. In more specific terms, each of the opposite sides of the rectangle 60 is equal to the length between adjacent straight lines extending at right angles with respect to the opposite sides. Therefore, in the instant embodiment, the rectangle 60 has four sides each of which equals the length (denoted by "d") between the adjacent straight lines. It is understood that the surface density of the patterns defined by the mask data is kept constant over a dielectric layer. This means that the plated metal on an evaporated thin metal layer has the same thickness over a dielectric layer.

It will be understood that the above disclosure is representative of only one possible embodiment of the present invention and that the concept on which the invention is based is not specifically limited thereto.

What is claimed is:

1. A method of obtaining mask data for use in forming multiple metal-interconnection layers on a substrate, comprising the steps of:

(a) generating a plurality of rectangular patterns which are respectively centered at cross points defined by straight lines that cross over each other at right angles;

(b) generating a plurality of interconnection patterns to be formed on said substrate;

(c) superimposing said plurality of rectangular patterns and said plurality of interconnection patterns and thereby generating a first set of superimposed patterns which includes said plurality of rectangular patterns and a plurality of continuous patterns corresponding to said plurality of interconnection patterns;

(d) extracting said plurality of continuous patterns from said first set of superimposed patterns and thereby generating a set of extracted continuous patterns;

(e) extracting said plurality of rectangular patterns from said first set of superimposed patterns using said set of extracted continuous patterns and thereby generating a set of extracted rectangular patterns; and (f) superimposing said set of extracted rectangular patterns and said plurality of interconnection patterns and thereby generating a second set of superimposed patterns which correspond to said mask data.

2. A method of obtaining mask data for use in forming multiple metal-interconnection layers on a substrate, comprising the steps of:

(a) generating a plurality of rectangular patterns which are respectively centered at cross points defined by straight lines that cross over each other at right angles;

(b) generating a plurality of interconnection patterns to be formed on said substrate;

(c) superimposing said plurality of rectangular patterns and said plurality of interconnection patterns and thereby generating a first set of superimposed patterns which includes said plurality of rectangular patterns and a plurality of continuous patterns corresponding to said plurality of interconnection patterns;

(d) extracting said plurality of continuous patterns from said first set of superimposed patterns and thereby generating a set of extracted continuous patterns;

(e) extracting said plurality of rectangular patterns from said first set of superimposed patterns using said set of extracted continuous patterns and thereby generating a set of extracted rectangular patterns; and (f) superimposing said set of extracted rectangular patterns and said plurality of interconnection patterns and thereby generating a second set of superimposed patterns which correspond to said mask data, wherein the area of each of said plurality of rectangular patterns is equal to the area of the portion of a continuous pattern within a rectangle each of adjacent sides of which are equal to the length between said straight lines.

* * * * *